(12) United States Patent
De Boeij et al.

(10) Patent No.: US 7,889,316 B2
(45) Date of Patent: Feb. 15, 2011

(54) METHOD FOR PATTERNING A RADIATION BEAM, PATTERNING DEVICE FOR PATTERNING A RADIATION BEAM

(75) Inventors: Wilhelmus Petrus De Boeij, Veldhoven (NL); Simon De Groot, Eindhoven (NL); Ewoud Vreugdenhil, Valkenswaard (NL); Johannes Wilhelmus De Klerk, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 487 days.

(21) Appl. No.: 11/433,766

(22) Filed: May 15, 2006

(65) Prior Publication Data

US 2007/0263190 A1 Nov. 15, 2007

(51) Int. Cl.
*G03B 27/42* (2006.01)
(52) U.S. Cl. .......................... 355/53; 355/55
(58) Field of Classification Search .............. 355/53, 355/403, 52, 55; 430/5, 20, 30
See application file for complete search history.

(56) References Cited

U.S. PATENT DOCUMENTS 6,180,289 B1 * 1/2001 Hirayanagi ............... 430/5

2005/0208427 A1 * 9/2005 Hayano et al. ............. 430/311

FOREIGN PATENT DOCUMENTS

JP 11-038638 2/1999

OTHER PUBLICATIONS

Office Action in related Japanese application No. 2007-120465 mailed Jun. 11, 2010.

* cited by examiner

*Primary Examiner*—Edward J Glick
*Assistant Examiner*—Mesfin T Asfaw
(74) *Attorney, Agent, or Firm*—Pillsbury Winthrop Shaw Pittman LLP

(57) ABSTRACT

A multiple-die mask pattern is arranged with dies having the same pattern in mutually opposite orientations. The method for arranging the dies includes analyzing the pattern of a single die to identify a pattern characteristic property which is non uniformly distributed over the area of the die. If the distribution is found to be asymmetric, a line separating the die area into two half-die areas is defined with respect to which the asymmetry is apparent. Half-die areas of different dies with the same pattern characteristic property are grouped together in the mask pattern. The resulting enhanced symmetry of the distribution of the pattern characteristic property over the mask area increases lithographic processability and thereby improves die yield.

19 Claims, 8 Drawing Sheets

METHOD FOR PATTERNING A RADIATION BEAM, PATTERNING DEVICE FOR PATTERNING A RADIATION BEAM

BACKGROUND OF THE INVENTION

1. Field of the Invention

The present invention relates to a patterning device for use with optical projection lithography comprising a substrate and a pattern on a surface of the substrate, the pattern including a plurality of dies.

2. Description of the Prior Art

In a conventional lithographic method a lithographic apparatus is used to image a desired pattern onto a substrate, usually onto a target portion of the substrate. A lithographic apparatus can be used, for example, in the manufacture of semiconductor devices including integrated circuits (IC devices). In that instance, a patterning device, which is alternatively referred to as a mask or a reticle, may be used to generate a circuit pattern to be formed on an individual layer of the IC device. On the reticle, the circuit patterns are arranged in one or more dies, each die corresponding to a layer of the semiconductor device. Usually, when the mask pattern includes a plurality of dies, each die corresponds to the same layer. This pattern of dies can be transferred onto a target portion on a substrate (e.g. a silicon wafer).

The lithographic apparatus comprises an illumination system to illuminate the mask and a projection system (also referred to as a projection lens) to transfer the pattern, via imaging, onto a layer of radiation-sensitive material (resist) provided on the substrate. In general, a single substrate will contain a network of adjacent target portions that are successively patterned.

Known lithographic apparatus include steppers or step-and-repeat apparatus, and scanners or step-and-scan apparatus. In a stepper each target portion is irradiated by exposing an entire pattern onto the target portion at one time, and the wafer is moved by a predetermined amount to a next position for a next exposure. In a scanner each target portion is irradiated by scanning the pattern through a radiation beam in a given direction (the "scanning" direction) while synchronously scanning the substrate parallel or anti-parallel to this direction, and next the wafer is moved to a next position for a next exposure.

Conventional optical projection lithography apparatus are used for exposing a resist layer on a substrate to a demagnified image of a mask pattern. The mask pattern is illuminated by radiation having a wavelength of, for example, 365 nm, or 248 nm, or 193 nm. Common materials for the lens elements of projection systems for use with radiation of 248 nm or 193 nm wavelength are quartz and $CaF_2$. These optical materials have a sufficiently high transmission for 248 and 193 nm radiation. However, in use some radiation is absorbed by these materials. Also, anti-reflection coatings on the surfaces of the optical lens elements may have a residual absorbance for the radiation used for imaging. Such absorbance causes a transfer of heat to the lens elements, and a subsequent thermal deformation of the lens elements.

Any such thermal deformation may lead to image aberration beyond tolerance, occurring during operation of the lithographic apparatus. Therefore, in optical projection lithography there is a need to control the image aberration (also referred to as optical aberration) due to thermal deformation of lens elements of the projection system.

An optical aberration can be thought of as consisting of constituent aberration contributions such as, for example, the commonly known lower-order aberrations called spherical aberration, coma, astigmatism, image curvature and distortion. Higher-order aberrations of these and other types are generally present as well in the optical aberration. Any of the aberration contributions can be categorized as either a symmetric aberration or an asymmetric aberration. A symmetry of an aberration contribution may relate to either a symmetry of the aberration magnitude with respect to the optical axis of the corresponding optical system, or to a symmetry of the aberration magnitude with respect to the center of an object field of the optical system. The object field of a projection lens of a projection lithography apparatus corresponds to the maximum area of a reticle which can be used for transfer of an IC layer pattern to a target portion on the substrate by imaging, using the projection system. This useable maximum area of a reticle is referred to hereinafter as the "field". An aberration such as for example lower and higher order spherical aberration which is rotationally symmetric with respect to the optical axis of the projection lens, may yet be asymmetrically distributed over the field, and be classified as an asymmetric aberration or asymmetric field distributed aberration.

Conventionally, control of image aberrations is achieved by position adjustment of one or more lens elements of the projection system, or by an adjustment of the mask and substrate positions and orientations, or by a combination of any of these adjustments. In particular, an adjustment of projection lens elements along an optical axis of the projection system (referred to as an adjustment in the z-direction or a z-adjustment) is suitable for correcting symmetric optical aberrations, such as may be caused by a symmetric thermal deformation of one or more lens elements of the projection system.

The correction of asymmetric aberrations (for example due to asymmetric thermal deformations of one or more lens elements) is much more difficult and generally only partially possible. For their reduction adjustment of lens element positions can still be used, however, lateral adjustments perpendicular to the direction of axial z-adjustments (referred to as x,y-adjustments) are generally required. To provide x,y-adjustments to one or more lens elements, dedicated lens manipulators must be incorporated in the projection system. Also, manipulators to provide a tilt to one or more lens elements may be needed. Since there is only a limited amount of any such actuators available, there is the problem of avoiding any inducement of asymmetric aberrations, in use, where these aberrations are absent or within tolerance with the optical projection system before use.

SUMMARY OF THE INVENTION

It is desirable to provide a lithographic process wherein a need for off axis adjustments of one or more lens elements of a lithographic projection system to control optical aberration is alleviated.

According to an embodiment of the invention, there is provided a method for patterning a radiation beam traversing a patterning device, comprising patterning the radiation beam with a pattern which includes at least two dies, each of the at least two dies having an axis separating the die in a first half-die area at one side of the axis with a first pattern, and a second half-die area at the other side of the axis having a second pattern, wherein a first property is associated with the first pattern, a second property is associated with the second pattern, and two directly adjacent half-die areas of the respective at least two dies have a same property, the same property being of one of the first property and the second property.

According to a further embodiment of the invention each property is a transmittance or a reflectance for radiation of the radiation beam, or a lithographic process window size.

According to an embodiment of the invention there is provided a patterning device for patterning a radiation beam with a pattern in its cross section including a substrate and a pattern on a surface of the substrate, the pattern including at least two dies, each of the at least two dies having an axis separating the die in a first half-die area at one side of the axis, having a first pattern, and a second half-die area at the other side of the axis, having a second pattern, wherein a first property is associated with the first pattern, a second property is associated with the second pattern, and two directly adjacent half-die areas of the respective at least two dies have a same property, the same property being of one of the first property and the second property.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE EMBODIMENTS

Figure 1:
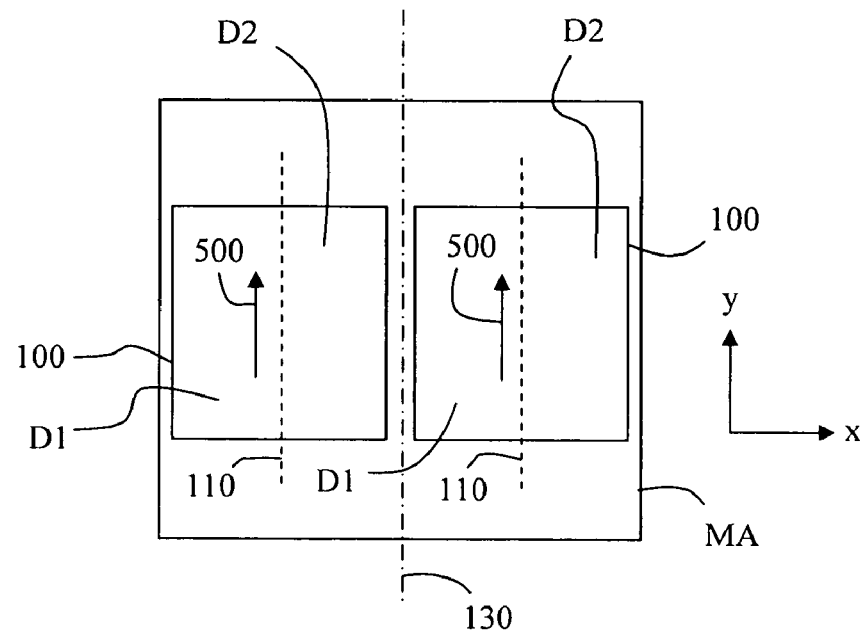
FIG. 1 depicts a conventional mask comprising two dies.

A first embodiment of the present invention concerns an arrangement of two dies on a reticle. A conventional arrangement of two dies is illustrated in FIG. 1; two dies 100 on a reticle MA are disposed side by side, symmetrically with respect to a central mask axis 130. Regions on the reticle MA are either transmissive or opaque to illumination radiation. For example, the substrate may be a glass substrate, and a surface of the substrate may carry a patterned chrome mask. The reticle MA includes a dark chromium layer on the clear glass substrate (such as for example a fused silica substrate) and in the case of a dark field mask the pattern features corresponding to the IC layer features are embodied as "bright" transparent areas in the chromium layer.

Each die 100 has a central axis 110 parallel to a side of the die and centered with respect to the die. For example, in FIG. 1 each die features a central axis along a y-direction parallel to the longer side of the rectangular die shape. Each die includes the same IC pattern layer, and has the same rectangular shape and orientation. The orientation is indicated by the arrows 500.

Figure 2:
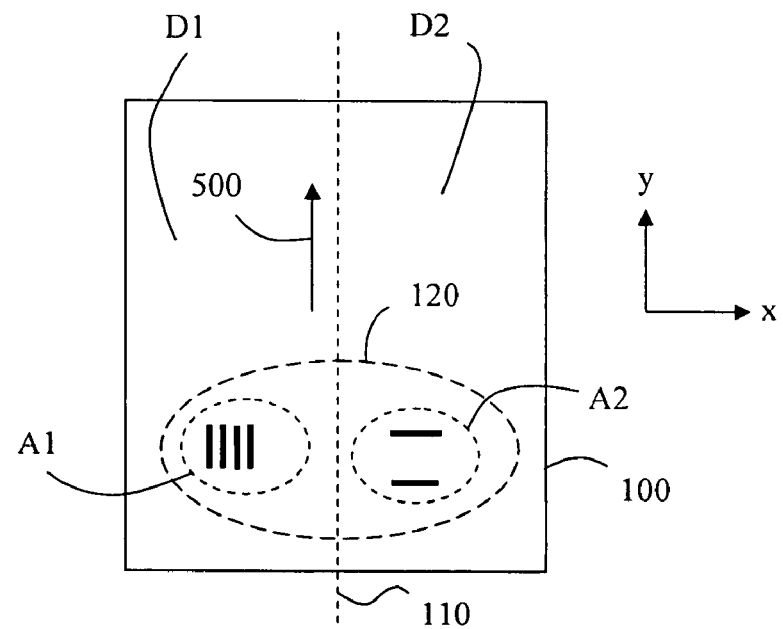
FIG. 2 depicts a layout of a single die in a first embodiment of the invention.

In FIG. 2 the layout of each single die 100 according to the present invention is illustrated in more detail. The chrome on glass die pattern (COG die patterns) is schematically indicated in FIG. 2 by the pattern 120. According to the present invention, the method for patterning a beam comprises analyzing the pattern of the die to identify a pattern characteristic property which is non uniformly distributed over the area of the die. If the distribution is found to be asymmetric, a line (separating the die area into two "half-die" areas) is defined with respect to which the asymmetry is apparent. For simplicity, in this embodiment it is assumed that the central axis 110 is such a line. A pattern characteristic property, hereinafter also referred to as a "pattern characteristic" or simply as a "property" associated with a pattern, is associated with the patterns disposed in each half-die area D1 and D2, respectively to the left and right of the central axis 110 in FIG. 1. The pattern characteristic property in the present embodiment is a radiation transmittance of at least a part of each of the patterned half-die areas D1 and D2. The transmittance refers to the transmittance for radiation used to expose the substrate in accordance with a lithographic process wherein the mask MA is used.

The COG die pattern 120 may include both transmissive dense features and transmissive isolated features, wherein a spatially averaged local transmission of the die-pattern in a first neighborhood A1 including primarily dense features necessarily is different from (higher than, in the case of a dark field reticle) a spatially averaged local transmission of the die-pattern in a second neighborhood A2 including primarily isolated features.

In an IC layer where these first and second neighborhoods A1 and A2 are respectively disposed in the left and right half-die areas D1 and D2, as illustrated in FIG. 2, a transmittance T1 of the half-die area D1 may be different from the transmittance T2 of the half-die area D2 (in the present embodiment T1>T2).

Since the orientation of each die 100 in the plane of FIG. 1 is the same (the arrows 500 point in the same direction), the half-die area D2 with a pattern characteristic transmittance T2 of one die faces a half-die area D1 with a different pattern characteristic transmittance T1 of the other die. Thus, a local transmittance of the mask MA is asymmetrically distributed along a direction perpendicular to the direction of the axes 110 and the mask axis 130. The distribution of local transmittance across the mask MA is referred to as a field distribution of transmittance.

Figure 3:
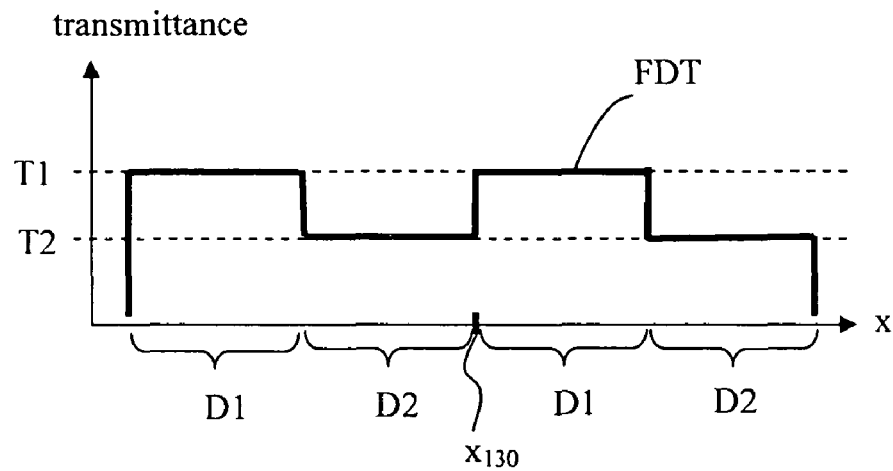
FIG. 3 depicts a transmittance distribution of a conventional mask pattern.

FIG. 3 illustrates schematically the field distribution of transmittance for the conventional two-die mask described above along an x-direction as indicated in FIG. 1. Schematically, this distribution may be approximated by a field distribution of transmittance FDT which alternates between transmittances T1 and T2. The field distribution of transmittance FDT is asymmetric with respect to the x-position $x_{130}$ of the mask axis 130. In FIG. 3, along the horizontal axis is indicated the extent along the x-axis of the half-die areas D1 and D2 for a conventional pattern lay out as illustrated in FIG. 1.

Figure 4:
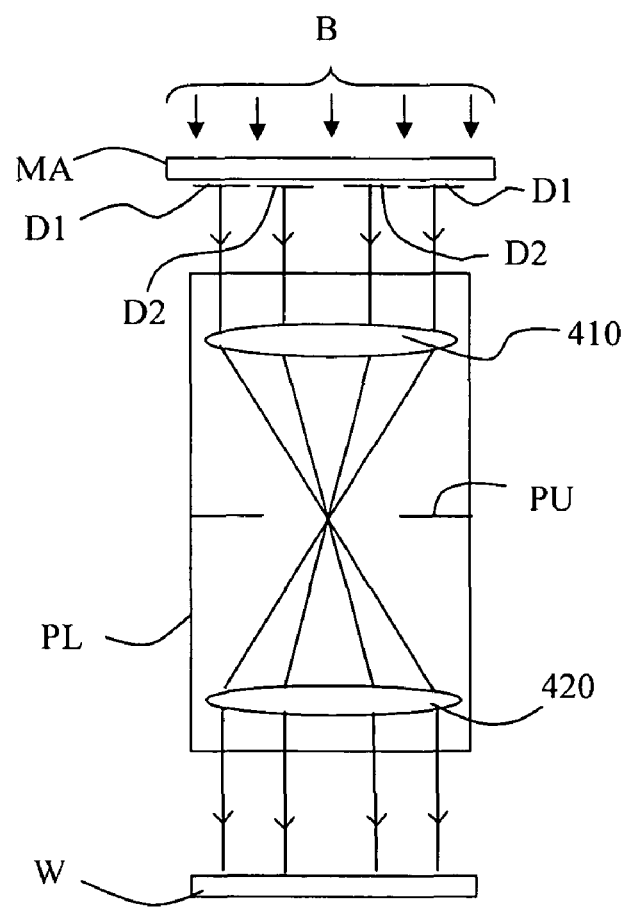
FIG. 4 depicts a lithographic projection system, and several optical paths traversed by corresponding image forming beams emanating from different sections of the mask.

In a lithographic printing process the reticle MA is uniformly illuminated by a beam of radiation B, as illustrated in FIG. 4. The reticle patterns in the half-die areas D1 and D2 are imaged, by the projection system PL, on a target portion on the substrate W. Because of the asymmetry of the field distribution of transmittance FDT, lenses or lens groups 410 and 420 of the projection system PL (respectively near the mask MA and a plane conjugate to the reticle MA) are subjected, during use, to an asymmetric radiation exposure, and hence to an asymmetric thermal load. The asymmetric thermal load leads to undesired asymmetric optical aberration contributions. Closer to the plane of the projection lens pupil PU, where image forming beams mutually overlap each other, this effect is less present or not present.

Figure 5:
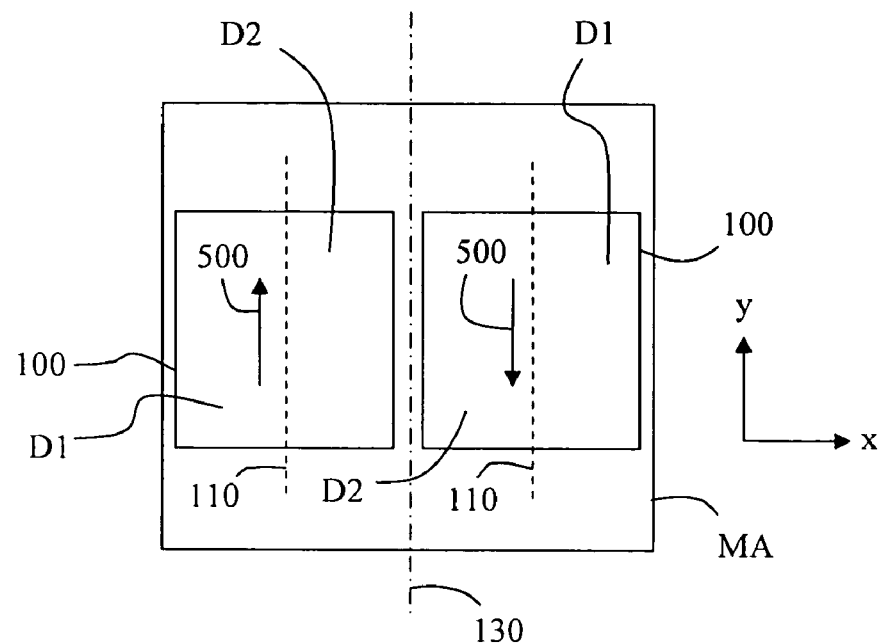
FIG. 5 depicts a mask comprising two dies according to a first embodiment of the present invention.

According to the present invention, the difficulty of correcting for asymmetric aberrations is alleviated by rearranging the dies on the reticle such that half-die areas of different dies but with a same pattern characteristic, here a same transmittance, are facing each other. By grouping together half-die areas of different dies with the same pattern characteristic property in the mask pattern, a resulting enhanced symmetry of the distribution of the pattern characteristic property over the mask area increases lithographic processability and thereby improves die yield. In FIG. 5 the orientation of each of the dies is again indicated by the arrows 500, wherein the left-right orientation of the half-die areas D1 and D2, when viewed along the arrow 500, is maintained. Arranging the half-die areas D1 and D2 of each die in accordance with the invention implies that adjacent dies are oriented 180° rotated with respect to each other, as illustrated by the pair of arrows 500 pointing in opposite directions.

Although such an opposite orientation of the dies may increase an effort related to mask inspection, the present arrangement of dies increases the symmetry of the field distribution of transmittance with respect to the central axis of the mask 130 compared to the asymmetric field distribution of transmittance FDT as shown in FIG. 3.

Figure 6:
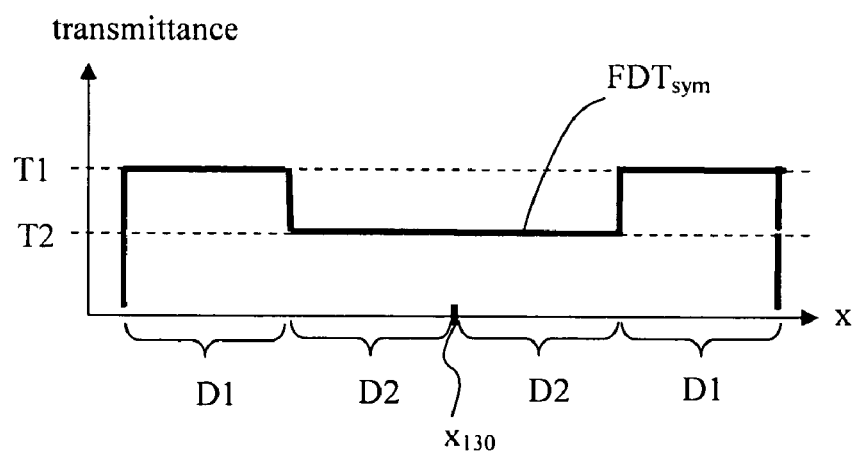
FIG. 6 depicts a transmittance distribution of a the mask depicted in FIG. 5.

The more symmetric field distribution of transmittance $FDT_{sym}$ is illustrated in FIG. 6, which is the same as FIG. 3 safe for the plotted field distribution of transmittance and the spatial arrangement of the half-die areas D1 and D2. Due to the enhanced symmetry of the field distribution of transmittance $FDT_{sym}$ over the symmetry of the field distribution of transmittance FDT, the induced distribution of heating of projection lens elements or lens element groups 410 and 420 also has an increased symmetry with respect to the optical axis of the projection system PL as well as with respect to the field, compared to the heating distribution when using the conventional mask lay out illustrated in FIG. 1. Hence, the thermally induced aberrations are distributed more symmetrically with respect to the optical axis as well as the field. As a result, conventional axial z-adjustment of projection lens elements or lens element groups, such as for example to adjust optical image field curvature and spherical aberration, can be used to compensate for the thermally induced aberrations. Thereby the need for use of x,y lens manipulators is alleviated.

According to an aspect of the invention, the mask is a reflective mask, including a patterned absorber layer to provide a contrast device for use with EUV radiation. Instead of a transmissive projection system PL, as shown in FIG. 4, an EUV lithographic projection apparatus includes a reflective projection system. The present invention can be used in such reflective lithographic apparatus in a way analogous to the embodiment described above. Instead of optimizing the symmetry of a field transmittance distribution, a field reflectance distribution with enhanced symmetry may be provided by a layout of the reticle pattern as described in FIG. 5.

Figure 7:
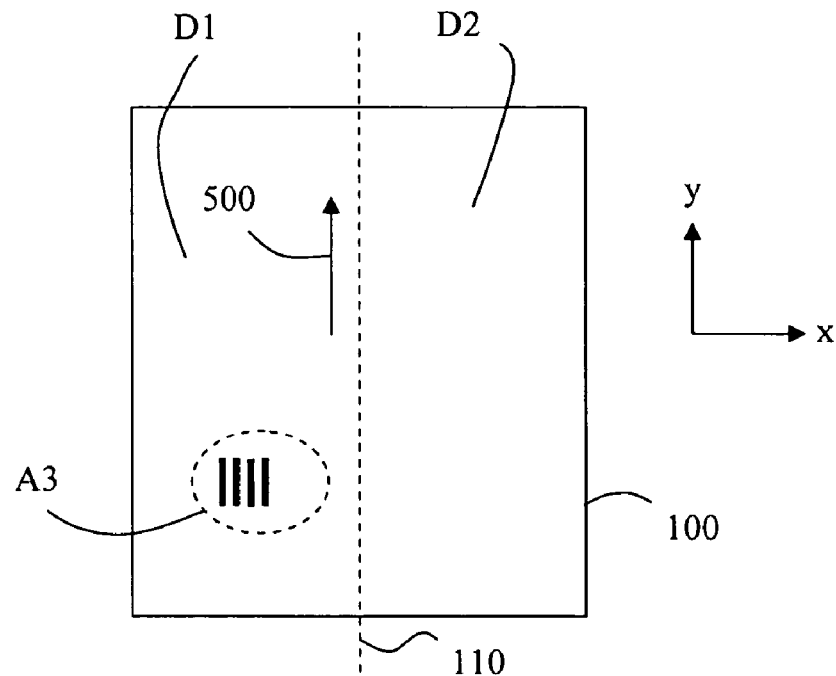
FIG. 7 depicts a layout of a single die in a second embodiment of the invention.

According to a second embodiment of the invention, the pattern characteristic property refers to a spatial distribution within a die of lithographic imaging and printing process-window. For example, a required focus range within which the substrate has to be positioned during exposure of the resist may be field-position dependent. Underlying such a field distribution of focus-range can be any spatial distribution, within a die, of critical features, i.e., features having a critical dimension CD in relation to another spatial distribution of non-critical features (having a minimum size greater than CD) within that same die. The critical dimension CD is the smallest lithographically printable dimension of features, for a given set of lithographic process parameters including, for example, a numerical aperture of the projection system, a given wavelength of the projection radiation, and a given exposure latitude and given depth of focus. In the present embodiment critical features such as dense lines and spaces are disposed in the die pattern as spatially grouped in a specific area A3 of the die, as illustrated in FIG. 7. FIG. 7 is the same as FIG. 2 except that a different pattern characteristic property is schematically indicated. In the area complementary to the area A3 primarily non critical features are present, and critical features may be absent. In this case the pattern characteristic associated with each half-die area D1 and D2, respectively on the left and right side of the die, when viewed along the direction of the arrow 500, is related to (or is) the presence of critical features having a critical dimension CD in a half-die area: the pattern characteristics for area D1 and D2 may be defined as, respectively "critical dimension sized features present" and "critical dimension sized features absent", or alternatively may be defined as a first focus-range FR1 and a second focus-range FR2.

When, as in the first embodiment, and referring to FIG. 1, a conventional mask pattern includes two adjacent dies 100 having the same orientation 500, there is now a problem of a mismatch between a field distribution of best focus (a property of the lithographic optical system including the reticle and the projection system) and a field distribution of critical dimension sized features (a pattern characteristic) or, alternatively, a field distribution of focus-range.

Figure 8:
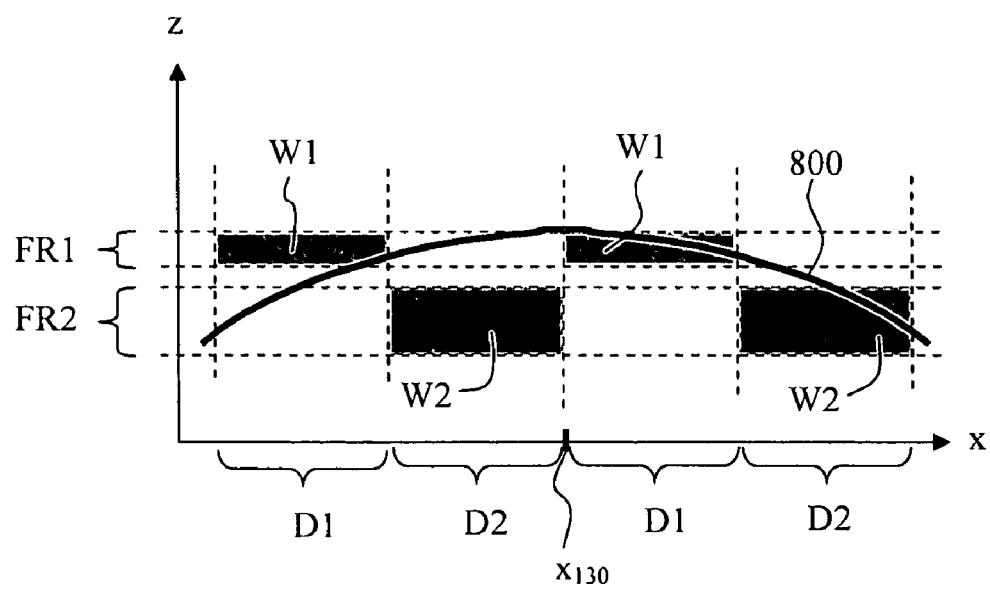
FIG. 8 depicts along the vertical axis the z coordinate of a position of best focus and of desired z-positions of a substrate for different die patterns; along the horizontal axis the x coordinate of a field point, and field distributions of respectively best focus and desired focus ranges for imaging different portions of dies.

Generally, an axial z-position of best focus is distributed symmetrically with respect to the center of the field, as schematically illustrated by the graph 800 in FIG. 8, which is representative for the field distribution of best focus of a conventional lithographic apparatus. Ideally, a notional surface of best focus (conjugate to a surface of the reticle provided with the mask pattern) is flat and parallel to the substrate surface (graph 800 ideally is a line parallel to the x-axis). However, due to symmetric lens aberrations the notional plane of best focus may be curved and be substantially parallel to the substrate only at or near the center of the target portion.

Further, and as illustrated in FIG. 8, a required focal position of the substrate to be exposed may depend on the size and layout of the features of the mask pattern. For example, in the present embodiment, a focus-range FR1 within which features having a critical dimension CD are imaged at a resolution and/or contrast within tolerance, is smaller than a focus range FR2 within which non critical features (with minimum sizes larger than CD) are imaged within tolerance. Generally, the two respective focus ranges FR1 and FR2 are also displaced with respect to each other along the z-direction, see FIG. 8, where the ranges FR1 and FR2 are indicated as non overlapping ranges.

In FIG. 8, along the horizontal axis is indicated the extent along the x-axis of the half-die areas D1 and D2 for a conventional pattern lay out as illustrated in FIG. 1. The shaded area W1 represents a process-window in focus-field space within which the dense features comprised in area A3 of the dies can be lithographically imaged and processed. Similarly, the process-window W2 represents the focus-field window within which the non critical features in the half-die area D2 of the dies in FIG. 1 can be lithographically imaged and processed. The process-window W2 associated with the right half-die area D2 of the left die in FIG. 1 is not traversed, in FIG. 8, by the graph 800. This illustrates a mismatch between the field distribution of required focus range in relation to the field distribution of best focus. Because of such a mismatch, the imaging of the non critical features of the left die in FIG. 1 may lead to loss of die yield because printed dimensions of die pattern features may be out of tolerance.

In principle it is possible to adjust the shape and position of the field distribution of best focus (as represented by graph 800 in FIG. 8) by an adjustment of positions and/or tilts of one or more projection lens elements or lens element groups, if needed in combination with a position and/or tilt adjustment of the mask MA. However, with any of these adjustments or combination of adjustments, a single best focus plane intersecting all four focus-field process-windows W1 and W2 associated with the first and second die is not readily obtainable because of the asymmetric field distribution of the process-windows with respect to the central mask axis 130, as illustrated in FIG. 8.

Figure 9:
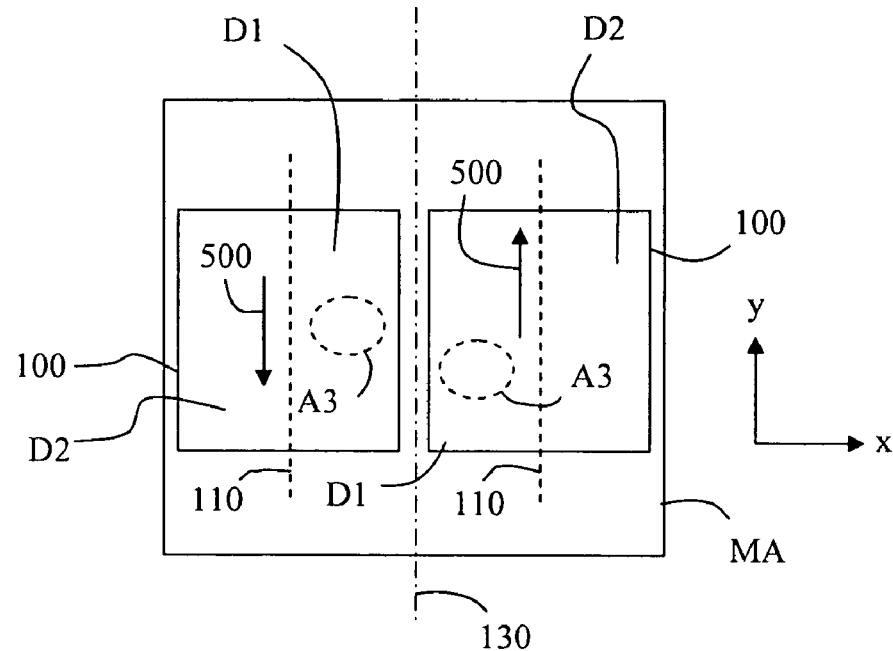
FIG. 9 depicts a mask comprising two dies according to a second embodiment of the present invention.

As in the first embodiment of the invention, the orientation of the two dies on the reticle is rearranged such that either the two different half-die areas comprising the area A3 wherein features of dimension CD are disposed or the two half-die areas not comprising the area A3 are facing each other, so that the half-die areas facing each other have the same pattern characteristic lithographic process window. As illustrated in FIG. 9, which is the same as FIG. 5 except that the orientations 500 are inverted, the two dies are arranged such that the half-die areas including the area A3 of each die are facing each other. The adjacent dies are oriented 180° rotated with respect to each other, as illustrated by the arrows 500 pointing in opposite directions.

Figure 10:
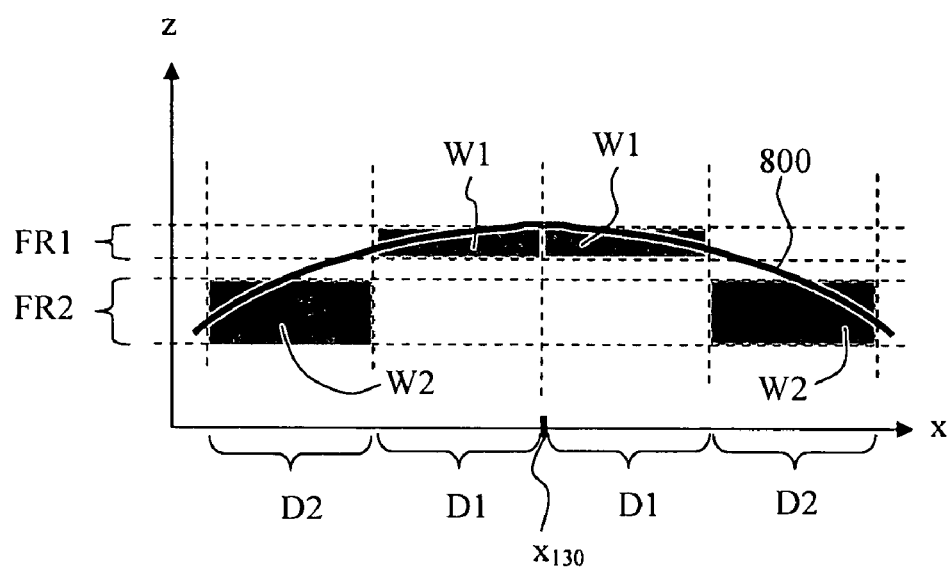
FIG. 10 depicts matched field distributions of respectively best focus and desired focus ranges for imaging different portions of dies for a lithographic process wherein the mask of FIG. 9 is used.

In FIG. 10 the corresponding effect of the arrangement of dies on a match between the field distribution of required focus range in relation to the field distribution of best focus 800 is illustrated. Both distributions are symmetric with respect to the mask central axis 130. Hence an improved match between the two distributions is obtained when compared to the situation depicted in FIG. 8. The present arrangement of dies better matches the field distribution of required focal ranges to the field distribution of best focus position, because symmetric shape changes of the graph 800 are obtainable with conventional, axial mask adjustments and projection lens element or lens element group adjustments. As a result improved imaging, lithographic processing and die yield are provided.

In the second embodiment the distinguishing pattern characteristic of the half-die areas D1 and D2 is not limited to a spatial distribution within a die of a lithographic process-window, but may include, for example, field distribution of transmittance as well.

According to another embodiment of the invention, there is provided a computer program containing one or more sequences of machine-readable instructions describing patterning a mask pattern layer wherein critical features of a die are grouped in a half-die area in accordance with a preselected focus-range field distribution. Similarly there is provided a data storage medium (e.g. semiconductor memory, magnetic or optical disk) having such a computer program stored therein.

Figure 11:
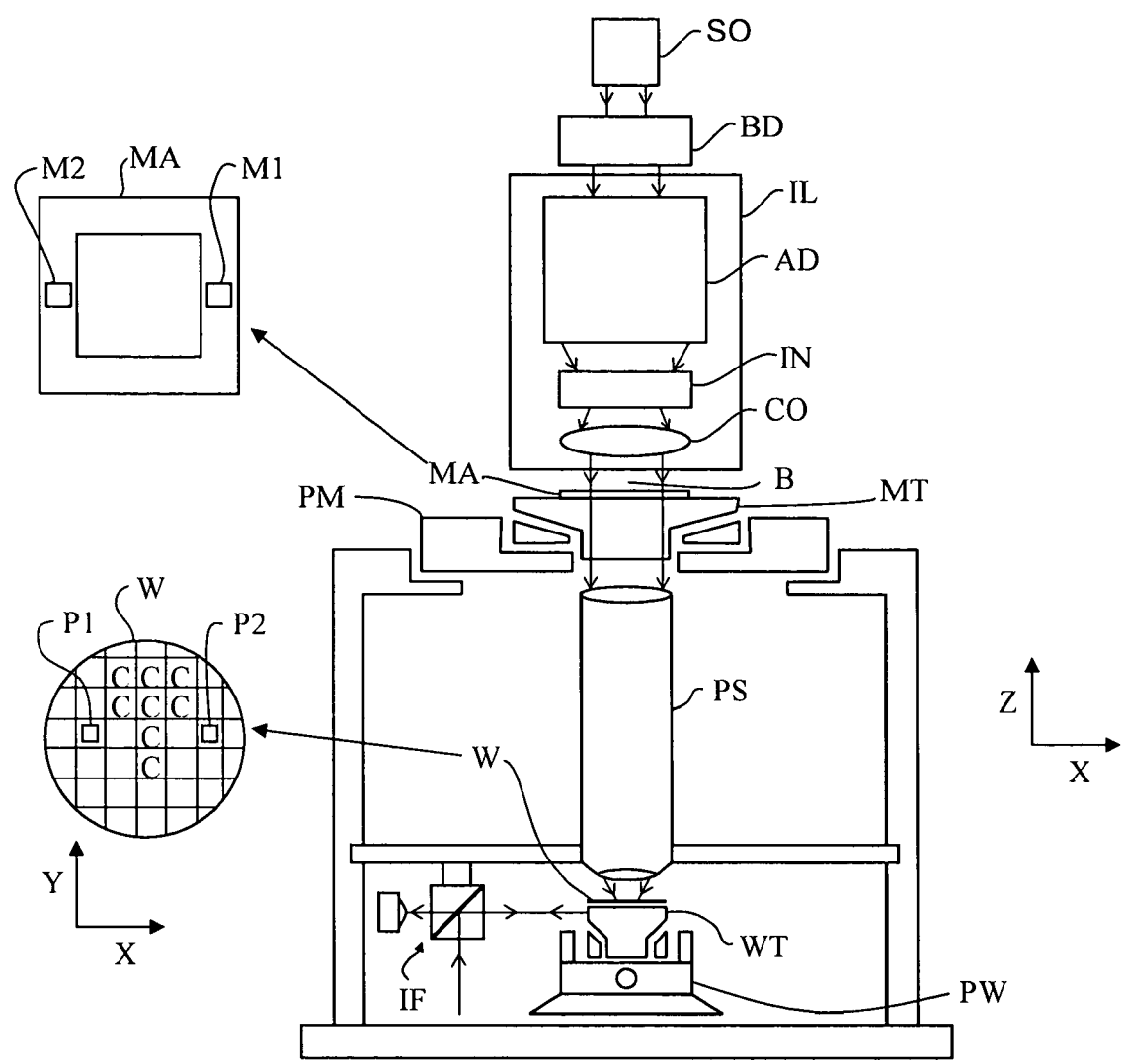
FIG. 11 depicts a lithographic apparatus according to an embodiment of the invention.

FIG. 11 schematically depicts a lithographic apparatus according to any of the embodiment of the invention described above. The apparatus includes an illumination system (illuminator) IL configured to condition a radiation beam B (e.g. UV radiation or radiation such as for example generated by an excimer laser operating at a wavelength of 193 nm or 157 nm, or by a laser-fired plasma source operating at 13,6 nm wavelength). A support (e.g. a mask table) MT is configured to support a patterning device (e.g. a mask) MA and is connected to a first positioner PM configured to accurately position the patterning device in accordance with certain parameters. A substrate table (e.g. a wafer table) WT is configured to hold a substrate (e.g. a resist-coated wafer) W and is connected to a second positioner PW configured to accurately position the substrate in accordance with certain parameters. A projection system (e.g. a refractive projection lens system) PS is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, and/or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 11) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm).

The term "lens", where the context allows, may refer to any one or combination of various types of optical components, including refractive and reflective optical components.

Figure 12:
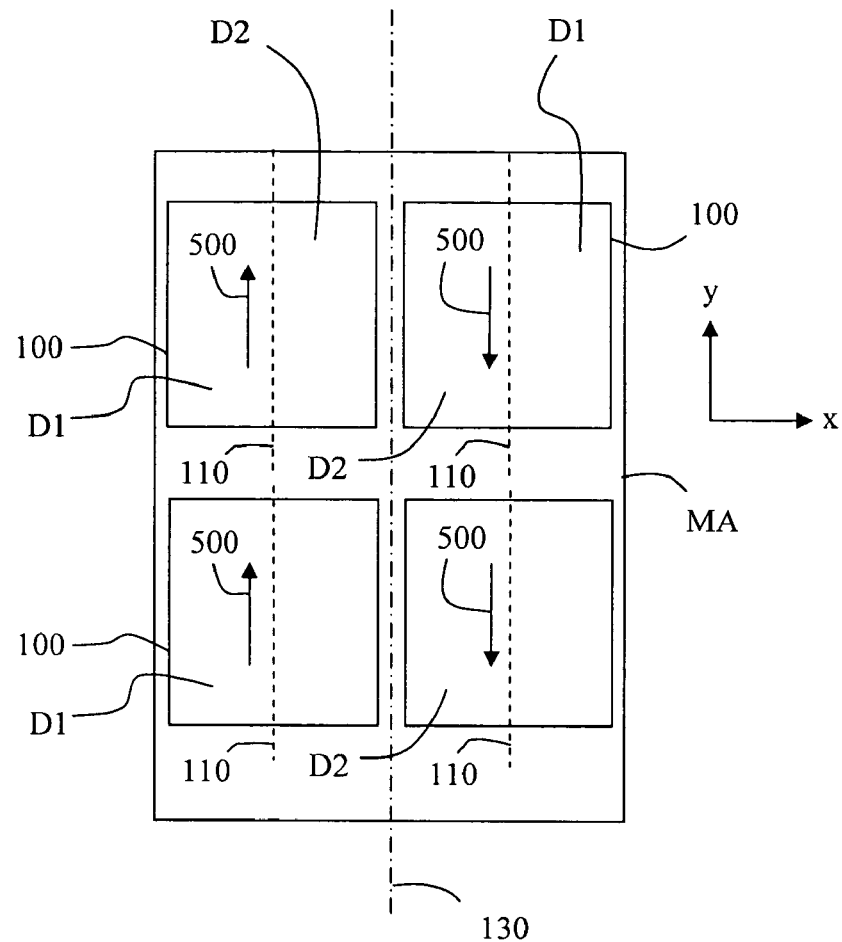
FIG. 12 depicts a mask comprising four dies according to an embodiment of the present invention.

According to an aspect of the invention, the first and second embodiments are not limited to masks comprising only two dies. The effects of the invention over conventional multi-die masks are obtained as well for a mask pattern lay out as illustrated in FIG. 12. In FIG. 12, four dies 100 have the same orientation 500 at each one side of the mask axis 130, and have opposite orientations 500 between these two sides. When, for example, the mask is used in a scanner lithographic apparatus with a scanning direction arranged along the y-axis in FIG. 12, a reduction of field dependent aberrations is obtained in direct analogy with the principle and working of the first and second embodiments.

Figure 13:
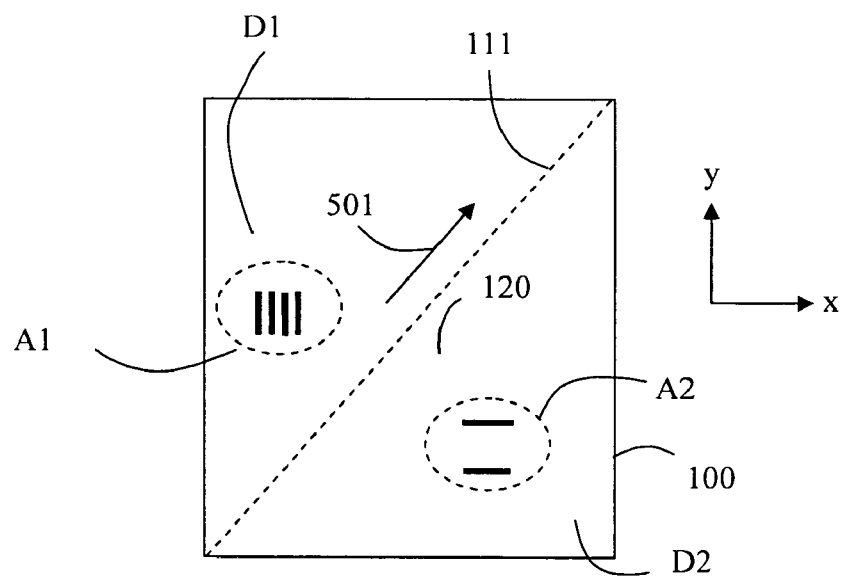
FIG. 13 depicts a diagonal division of a die pattern into two half-die areas each having a different pattern.
Figure 14:
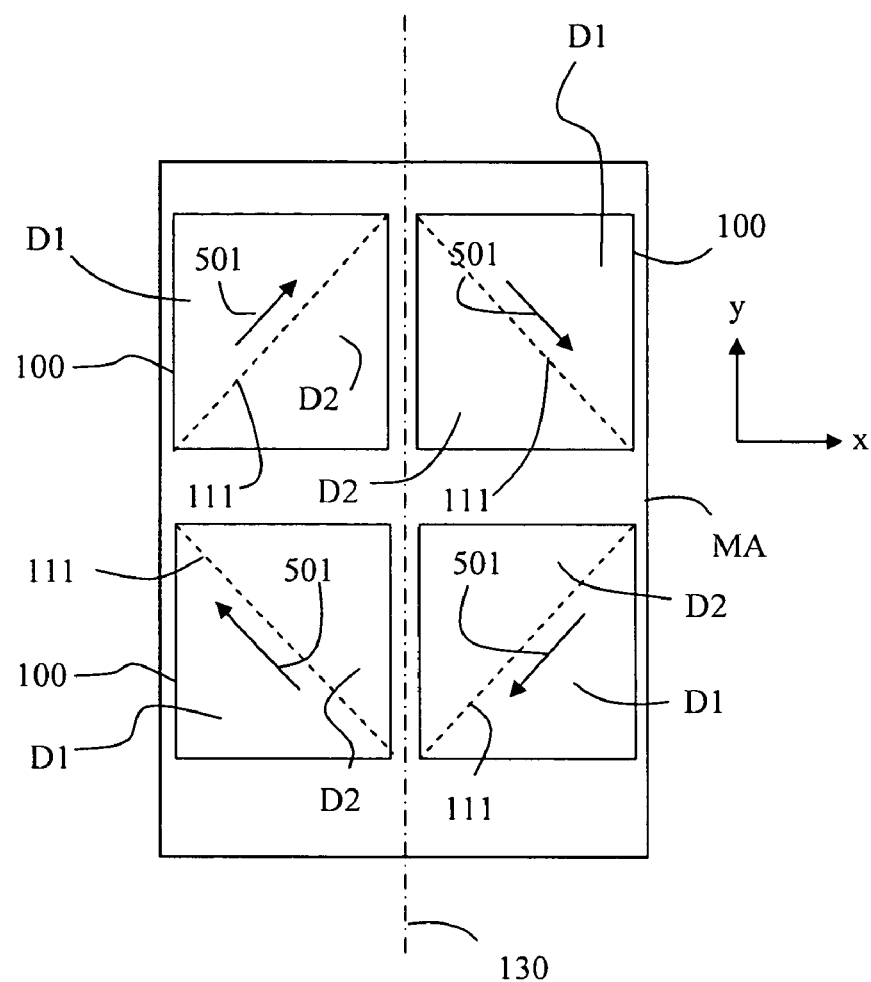
FIG. 14 depicts a mask comprising four dies according to FIG. 13, and arranged according to an embodiment of the present invention.

According to an aspect of the invention, the central axis of the die as defined in the first and second embodiment is not limited to an axis parallel to a side of the die, but may for example only be a "central" axis in the sense that it crosses the geometric center of a die. This is illustrated in FIG. 13, where the two half-die areas are defined by a diagonal central axis 111. Similarly, an arrow defining the orientation of the die is not limited to an arrow parallel to a side of the die, and may be chosen parallel to a diagonal, as illustrated by the arrow 501 in FIG. 13. With a step-and-repeat lithographic apparatus, the effects of the invention over conventional multi-die masks can be obtained by arranging a plurality of dies such that, as in the previous embodiments, half-die areas with the same pattern related property are directly adjacent, as illustrated in FIG. 14. Due to an enhanced rotational symmetry of the mask pattern as a whole a reduction of field dependent aberrations is obtained in direct analogy with the principle and working of the first and second embodiments.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

What is claimed is:

1. A method for patterning a radiation beam traversing a patterning device, comprising:
   patterning the radiation beam with a pattern which includes
   a first die and a second die, each of the two dies having an axis separating the die in
   a first half-die area at one side of the axis with a first pattern, and
   a second half-die area at the other side of the axis having a second pattern, wherein
   a value, range or distribution of a first pattern characteristic property is associated with the first pattern;
   a value, range or distribution of a second pattern characteristic property is associated with the second pattern, and
   a half-die area of the first die and a half-die area of the second die directly adjacent that half-die area of the first die have a substantially same value, range or distribution of a same property, the same property being the first pattern characteristic property or the second pattern characteristic property.

2. A method according to claim 1, wherein the axis separating each die forms an angle of at least 0°, and not more than 45°, with an axis between the two dies.

3. A method according to claim 2, wherein the radiation beam is traversing a projection system of a lithographic apparatus.

4. A method according to claim 2, wherein each pattern characteristic property is a transmittance for radiation of the radiation beam.

5. A method according to claim 2, wherein each pattern characteristic property is a reflectance for radiation of the radiation beam.

6. A method according to claim 3, wherein each pattern characteristic property is a lithographic process window size.

7. A method according to claim 6, wherein the process window is a range of focus positions of a substrate required for exposure of the substrate using the lithographic apparatus.

8. A patterning device for patterning a radiation beam with a pattern in the cross section of the beam including a substrate and a pattern on a surface of the substrate, the pattern including a first die and a second die, each of the two dies having an axis separating the die in
   a first half-die area at one side of the axis, having a first pattern, and
   a second half-die area at the other side of the axis, having a second pattern, wherein
   a value, range or distribution of a first pattern characteristic property is associated with the first pattern;
   a value, range or distribution of a second pattern characteristic property is associated with the second pattern, and
   a half-die area of the first die and a half-die area of the second die directly adjacent that half-die area of the first die have a substantially same value, range or distribution of a same property, the same property being the first pattern characteristic property or the second pattern characteristic property.

9. A lithographic apparatus according to claim 8, wherein the axis separating each die forms an angle of at least 0°, and not more than 45°, with an axis between the two dies.

10. A patterning device according to claim 9, wherein each pattern characteristic property is a transmittance for radiation of the radiation beam.

11. A patterning device according to claim 9, wherein each pattern characteristic property is a reflectance for radiation of the radiation beam.

12. A patterning device according to claim 9, wherein each pattern characteristic property is a lithographic process window size.

13. A patterning device according to claim 12, wherein the process window is a range of focus positions of a substrate required for exposure of the substrate using the patterning device and a lithographic apparatus.

14. A lithographic apparatus, comprising:
   an illumination system configured to condition a beam of radiation;

a support configured to support a patterning device, the patterning device being configured to impart the radiation beam with a pattern in the cross section of the beam;

a substrate table configured to support a substrate; and a projection system configured to project the patterned radiation beam onto a target portion of the substrate, wherein the patterning device is configured to provide a pattern including a first die and a second die, each of the two dies having an axis separating the die in
- a first half-die area at one side of the axis, having a first pattern, and
- a second half-die area at the other side of the axis, having a second pattern, wherein
  - a value, range or distribution of a first pattern characteristic property is associated with the first pattern;
  - a value, range or distribution of a second pattern characteristic property is associated with the second pattern, and
- a half-die area of the first die and a half-die area of the second die directly adjacent that half-die area of the first die have a substantially same value, range or distribution of a same property, the same property being the first pattern characteristic property or the second pattern characteristic property.

15. A lithographic apparatus according to claim 14, wherein the axis separating each die forms an angle of at least 0°, and not more than 45°, with an axis between the two dies.

16. A lithographic apparatus according to claim 15, wherein each pattern characteristic property is a transmittance for radiation of the radiation beam.

17. A lithographic apparatus according to claim 15, wherein each pattern characteristic property is a reflectance for radiation of the radiation beam.

18. A lithographic apparatus according to claim 15, wherein each pattern characteristic property is a lithographic process window size.

19. A lithographic apparatus according to claim 18, wherein the process window is a range of focus positions of the substrate required for exposure of the substrate using the patterning device and the lithographic apparatus.

* * * * *